United States Patent [19]

Oba et al.

[11] Patent Number: 5,222,307
[45] Date of Patent: Jun. 29, 1993

[54] DRYING METHOD AND APPARATUS THEREFOR

[75] Inventors: Yoichi Oba; Shota Oba, both of Tokyo, Japan

[73] Assignee: Interface Technical Laboratories Co., Ltd., Tokyo, Japan

[21] Appl. No.: 721,493

[22] PCT Filed: Nov. 21, 1990

[86] PCT No.: PCT/JP90/01521

§ 371 Date: Jul. 9, 1991

§ 102(e) Date: Jul. 9, 1991

[87] PCT Pub. No.: WO91/07239

PCT Pub. Date: May 30, 1991

[30] Foreign Application Priority Data

Nov. 21, 1989 [JP] Japan ................. 1-302560
Dec. 14, 1989 [JP] Japan ................. 1-324329

[51] Int. Cl.⁵ ................................. F26B 7/00
[52] U.S. Cl. ........................... 34/13; 34/73; 34/15; 34/66
[58] Field of Search ............ 34/73, 74, 76, 62, 13, 34/17, 16, 36, 37, 66, 4

[56] References Cited

U.S. PATENT DOCUMENTS

| | | | |
|---|---|---|---|
| 787,093 | 4/1905 | Gathmann | 34/73 |
| 805,367 | 11/1905 | Lapp | 34/73 |
| 942,150 | 12/1909 | Tiemann | 34/74 |
| 3,262,212 | 7/1966 | Buhr | 34/4 |
| 3,762,065 | 10/1973 | Wahlgren | 34/73 |
| 3,943,002 | 3/1976 | Schenerle et al. | |
| 4,841,645 | 6/1989 | Bettcher et al. | |

FOREIGN PATENT DOCUMENTS

| | | |
|---|---|---|
| 58-210888 | 12/1983 | Japan . |
| 62-149137 | 7/1987 | Japan . |
| 62-195128 | 8/1987 | Japan . |
| 64-38182 | 2/1989 | Japan . |
| 2-194883 | 8/1990 | Japan . |

OTHER PUBLICATIONS

Patents Abstracts of Japan, vol. 10, No. 170 (E-412) (2226) Jun. 17, 1986 & JP-A-61 023 324 (Hitachi Seisakusho K.K.) Jan. 31, 1986.

Primary Examiner—Henry A. Bennet
Assistant Examiner—Denise L. Gomada
Attorney, Agent, or Firm—Frishauf, Holtz, Goodman & Woodward

[57] ABSTRACT

A drying method for removing free water resided on electronic parts such as semiconductors, liquid-crystal display devices and printed wiring boards, optical parts such as lenses and prisms, and precision instrument parts such as gears and lead frames having been subjected to advanced cleaning, surface treatments, etc. and to an apparatus therefor. After an object to be dried (A) is placed in a vessel (1), the air present in the inner space of the vessel (1) is replaced with a heated vapor to heat the object to be dried (A) with the heated vapor, and the introduction of the heated vapor is stopped to cool the inner space of the vessel (1) in such a state that the vessel (1) is sealed from the outer air, followed by introduction of a dry gas to the vessel (1). The vessel (1) has a heated vapor introduction pipe (4), a cooling section (8) for cooling the inner space of the vessel (1), a condensate discharge pipe (14) and a dry gas introduction pipe (7). The vessel also has a holder (11) for holding the object to be dried thereon, which thermally insulate the cooling section (8) from the object to be dried (A).

11 Claims, 4 Drawing Sheets

DRYING METHOD AND APPARATUS THEREFOR

TECHNICAL FIELD

This invention relates to a drying method for removing free water from electronic parts such as printed wiring boards, optical parts such as lenses and prisms, and precision instrument parts such as gears and lead frames having been subjected to advanced cleaning, surface treatments, etc. and to an apparatus therefor.

BACKGROUND

It is required in the drying of electronic parts such as semiconductors, liquid-crystal display devices and printed wiring boards, optical parts such as lenses and prisms, and precision instrument parts such as gears and lead frames having been subjected to advanced cleaning, surface treatments, etc. to give a high level of finish of drying inexpensively as well as to remove the free water residing on the surface of these parts, with safety and in a short time.

While a suitable drying method is generally selected taking the level of finish of drying to be expected for the object to be dried, efficiency of drying operation and cost into consideration, no drying method conventionally used, as shown below, can satisfy all of these requirements and development of a novel drying method has been expected.

(1) Wiping

In the wiping method, the free water is removed by wiping the wet surface with a piece of cloth or sponge. Although this drying method is simple and easy, it is difficult to apply it to small and complicated parts, and further the level of finish of drying is not good enough coupled with poor workability.

(2) Circulated Hot-Air Drying

While the circulated hot-air drying, in which objects to be dried are placed in a chamber where a hot air is circulated, is widely employed because of the ease of handling, the circulated air should be absolutely free from dusts or oily component for the purpose of preventing secondary contamination of the objects to be dried since the objects to be dried are directly exposed to the hot air. However, it is actually impossible to remove such contaminants completely, so that a high level of finish of drying cannot be expected.

(3) Gas (Air or Nitrogen Gas) Blowing

In the drying method using air or nitrogen gas blowing the objects to be dried, a large amount of high-purity gas is required. This results in higher costs. Further, the portions of the objects which are not exposed to the flow of gas cannot be dried well, leading to nonuniform drying, disadvantageously.

(4) IR or FIR Irradiation

In the drying method using IR or FIR as a heat source for drying, a high level of finish of drying can be expected if the ambient (environment) is clean, but drying proceeds only slowly, and large and complicated shapes of objects to be dried are liable to undergo nonuniform drying.

(5) Vacuum Drying

In the vacuum drying, objects to be dried are placed in a chamber and the free water is removed by evaporation by reducing the internal pressure of the chamber using a vacuum pump and the like. However, since a great latent heat of vaporization is lost from the objects upon evaporation of the free water, the objects are cooled whereby to require a long time for the evaporation (drying) of the free water. Further, there is a fear of contamination of the objects to be dried with the oil using in the vacuum pump.

(6) Spin-Out Drying

In the spin-out dr the free water is spun off by the centrifugal force and the object can advantageously be dried in a very short time. However, the water flung off, frequently containing contaminant, drifts in the form of mist within the apparatus and redeposits or contaminates the dried objects, disadvantageously.

(7) Drying with Solvent Vapor

In this drying, objects to be dried are brought into contact with a vapor of a hydrophilic or solvent to replace the free water with the solvent. This method can give good finish of drying. However, as an inflammable solvent such as IPA (isopropyl alcohol) is generally used as the hydrophilic solvent, an explosion-proof structure for the prevention of taking fire or a fire-extinguishing equipment should be installed.

(8) Water Replacement Drying.

In the water replacement drying method, the free water on the surface of the object to be dried is removed with a nonflammable water replacing agent (water repellent) such as Freon 113/alcohol or Freon 113/surfactant, followed by finishing using a nonflammable organic solvent, e.g. Freon 113 to remove the water replacing agent. This method has an advantage that the object can easily be dried using a nonflammable solvent, but the surface of the object to be dried tends to be made hydrophobic to some degree (which is believed to be caused by the adsorption of Freon), so that the level of finish of drying is not good enough. Besides, since Freon 113 is said to be a causative of ozone layer destruction, this method is not preferred.

DISCLOSURE OF INVENTION

This invention provides a method and apparatus for drying electronic parts such as semiconductors, liquid-crystal display devices and printed wiring boards, optical parts such as lenses and prisms, and precision instrument parts such as gears and lead frames having been subjected to advanced cleaning, surface treatment, etc., which satisfies all of the requirements unachievable by the conventional methods, and which removes the free water residing on the surface of such parts with safety and in a short time to give a high level of finish of drying inexpensively.

A feature of this invention is to provide a method of drying an object by heating the object to be dried placed in a vessel with a vapor generated by boiling (hereinafter refered to as heated vapor), followed by cooling of the space within the vessel and an apparatus therefor, characterized in that the air present in the space within the vessel is replaced with the heated vapor, that the cooling operation is carried out, after the introduction of the heated vapor is stopped, with the vessel being sealed from the outer air and that a dry gas is introduced into the vessel after completion of the cooling operation.

The heated vapor to be used here should have a temperature (boiling point) at which the vapor pressure is at least equal to atmospheric pressure (760 mmHg). While water is usually used as the source of the heated vapor in view of safety, a hydrophilic organic solvent having a boiling point lower than that of water, for example, lower alcohols such as methanol, ethanol and IPA (isopropyl alcohol) or acetone can be used taking heat resistance of the object to be dried into consideration. A suitable hydrophilic organic solvent can be selected further taking chemical resistance of the object to be dried and cost of solvent into consideration.

For example, boiling points of various sources of heated vapors are shown below (together with the vapor pressures at 20° C.).

| Source of vapor | Boiling point (°C.) | Vapor pressure at 20° C. (mmHg) |
| --- | --- | --- |
| Acetone | 56.3 | 185.9 |
| Methanol | 64.7 | 97.3 |
| Ethanol | 78.3 | 44.1 |
| IPA | 82.4 | 32.7 |
| Water | 100 | 17.5 |

The procedures and action of the present drying method will be described below referring to FIG. 1; wherein the axes of ordinates show surface temperature T (° C.) of the object to be dried, the moisture content W (mg/l) in the space within the vessel, the amount of free water M (g/m$^2$) residing on the surface of the object to be dried and the amount of condensate Q (g) in the graphs (a), (b), (c) and (d), respectively; whereas the axes of abscissas show elapsed time t. The heated vapor used in the following description should be understood to be a 100° C. water vapor (steam). The drying procedures will be described step by step from (1) to (6).

(1) An object to be dried is placed in a vessel, and the vessel is closed with a cover (time: $t_0$).

At this moment, the respective values are as follows: $T_0$ (room temperature), $W_0$ (calculated from the saturated steam density at $T_0$ and the relative humidity in the same atmosphere), $M_s$ (e.g. in the case of 10 μm water film, $M_s = 10$ g/m$^2$), and Q (zero, since condensate is formed during the drying process).

(2) A steam is introduced into the vessel (time: $t_1 \rightarrow t_2$)

Thus, the air within the vessel is replaced with the steam to finally ($t_2$) fill the space within the vessel with the steam. The steam heats the object to be dried and the vessel until their temperatures are substantially equal to that of the steam temperature while it is condensed on the surfaces of the object to be dried and of the inner wall of the vessel (the amount of condensate: Q shows a peak value at the initial stage of this step; since the surface temperature of the object to be dried is lower than that of of the steam at the initial stage of heating, it is condensed on the surface of the object to be dried to repel the free water resided thereon, so that the amount of free water M resided thereon is apparently increased for a while). As the temperature of the object to be dried and that of the vessel approximate the steam temperature, the amount of condensate decreases (total amount of condensate: I), and at the point where their temperatures are substantially equal to the steam temperature, the free water (in fact, condensate) resided on the surface of the object to be dried and of the inner wall of the vessel are replaced with the steam to form no condensate any more ($Q \rightarrow 0$ g), whereupon the object to be dried is in a saturated steam atmosphere (relative humidity = 100%; $W_2 = 598$ mg/l) under the vapor pressure of 760 mmHg (the amount of free water deposited on the object to be dried: $M = 0$ g/m$^2 = M_f$).

(3) After confirmation of the state that the vessel is filled with the steam and the object to be dried is heated to the steam temperature, the introduction of the steam is stopped. The vessel is then sealed from the outer air, and the space within the vessel is cooled (time: $t_2 \rightarrow t_3$). Upon cooling of the space within the vessel, the steam present in the space within the vessel starts to condense on the surface of the cooling section (total amount of condensate: II), whereby the pressure of the space within the vessel is gradually reduced (e.g. cooling to 20° C. achieves reduction in the saturated vapor pressure at 20° C. to 17.5 mmHg). It should be noted here that W at this moment, i.e. $W_3$, is 17.3 mg/l which corresponds to the saturated vapor density at 20° C. (relative humidity: 100%). Since the object to be dried is thermally isolated (insulated) from the cooling section as will be described later and due to the great heat capacity of the object to be dried and to the poor heat conductivity of the space within the vessel assuming a reduced pressure (vacuum), the surface temperature $T_3$ of the object to be dried is considerably higher than the temperature of the space within the vessel (negative temperature gradient from the object to be dried toward the cooling section), and thus the moisture in the space near the surface of the object to be dried condenses in high efficiency on the cooling section rather than on the surface of the object to be dried.

(4) When no gain in the amount of condensate within the vessel is observed ($t_3$), cooling of the space within the vessel is stopped and a dry gas is introduced thereinto.

As the inside of the vessel recovers the atmospheric pressure, the relative humidity therein drops from $W_3$ to $W_4$ ($<W_0$).

A clean gas having a relative humidity of as low as possible is preferred as the dry gas, and usually an incombustible gas with a RH of 10% or less which is further dried, as necessary, with a drier and the like, such as air and nitrogen gas is used. This operation prevents redeposition of the free water onto the surface of the object to be dried (wherein the fact that the temperature of the object to be dried has dropped from $T_3$ to $T_4$ and the thermal energy corresponding to the temperature loss serves as a source of the latent heat of vaporization for the residual moisture in the vessel contributes to the prevention of redeposition of the free water onto the surface of the object to be dried).

(5) After the inside of the vessel recovered the atmospheric pressure, the object to be dried is taken out therefrom.

(6) The steps (1) to (5) are repeated.

As described above, according to the drying method of this invention, the object to be dried is first heated with the steam (where the steam having released thermal energy of course condenses on the surface of the object to be dried to gradually replace the free water resided thereon and finally at the point the object to be dried is heated to the steam temperature, the condensate is replaced with the steam) to fill the space within the vessel with the steam, and after the vessel is sealed from the outer air, the space within the vessel containing the object to be dried is cooled to effect condensation of the moisture present therein (the pressure of the space within the vessel is consequently reduced), finally a dry gas is introduced to the inner space of the vessel utilizing the operation of allowing the inside of the vessel to recover the atmospheric pressure, to effect drying of the object. Accordingly, it is important that the cooling section and the object to be dried are in a heat conductive relationship only through a gas phase and that the condensate formed on the cooling section should be prevented from redepositing on the object to be dried. In the apparatus according to this invention, the object to be dried placed in the vessel is dried by sufficiently heating it with a heated vapor, followed by cooling of the space within the vessel. This apparatus comprises a vessel for accommodating objects to be dried, having a heated vapor introduction means, a cooling system for cooling the space within the vessel, a section for collecting and discharging the condensate and a dry gas introduction means, and the vessel has a structure where the cooling section of the cooling system can thermally be insulated from the objects to be dried, and the inner space of the vessel can be sealed from the outer air.

As the vessel, a cylindrical steel container having an open top (through which objects to be dried can be introduced thereto or taken out therefrom) and a closed bottom (where condensate can be collected and discharged through a pipe connected thereto) which can be closed at the top with a cover is used. The reason why the vessel has a cylindrical shape is because it should have a pressure tight structure since the drying process is carried out under reduced pressure even temporarily. It is of course possible to use various types of pressure tight vessel. The heated vapor introduction means usually means a pipe, communicating to the source of the heated vapor disposed outside the system, having a valve for controlling/shutting-off the flow of the heated vapor. However, a liquid or the source of the heated vapor may preliminarily be poured into the vessel, which may be heated, for example, with an electric heater or a steam heater preliminarily disposed in contact with the vessel to generate vapor within the system. When the steam heater is used, the cooling section of the cooling means (usually an indirect cooling system where the vessel has a double-sided wall structure at the side wall and/or the bottom or where a cooling pipe is disposed around the inner space of the vessel, through which a cooling medium is passed from the outside of the system) may be utilized as the heater, since the heated vapor introducing operation and the cooling operation are performed sequentially. In this case a valve for selectively introducing the heating medium or cooling medium to the system is necessary. Incidentally, the cooling section is disposed with some horizontal distance from the position where the object to be dried is placed or a partition is disposed therebetween (when the cooling section is disposed substantially at the same level as the level of the object to be dried), or alternatively, the cooling means is disposed below said position, so that the condensate to be formed on the surface of the cooling section may not be in contact with the object to be dried during the cooling operation. Further, in order to achieve thermal insulation between the object to be dried and the cooling section, the object to be dried is placed on a holder made of a material having a low thermal conductivity directly or through a member made of the same material, or it may be suspended from the top of the vessel directly or as carried in a container such as a basket. The section for collecting and discharging condensate is a space defined at the bottom of the vessel, which is provided with a condensate discharge pipe, at the lowermost position, having a valve for maintaining vacuum within the vessel, and which has a capacity to allow the total amount of condensate II as shown in FIG. 1-(d) to stay therein or has a depth in which a level gauge can function. While the shape of the above section may not be limited, it is preferably conical in view of the efficiency of collecting condensate. When the heated vapor for heating the object to be dried is generated within the system, consideration must be taken that the section for collecting and discharging condensate is allowed to have a capacity necessary for preventing the heater from heating without any liquid staying at the section. As the structure which can seal the inner space of the vessel from the outer air, a trap formed by liquid-sealing the lower end of the condensate discharge pipe with water is usually used, (the condensate to be formed during the operation of introducing the heated vapor is discharged to the outside of the vessel through the trap). While the dry gas introduction means usually means a piping (having a flow control valve and/or a shut-off valve) communicating to an external gas source, when the heated vapor is introduced from the outside of the system, the dry gas introduction means may also be used as the heated vapor introduction means, since the heated vapor introduction and dry gas introduction are performed sequentially (in this case a change-over valve for selectively introducing the heated vapor or the gas is necessary).

Since the drying method of this invention is of batch-wise, a plurality of such drying apparatuses are usually provided depending on the line speed of the system of producing the objects to be dried. However, a single or a very small number of drying apparatus having an increased processing ability per unit time can be used.

BRIEF DESCRIPTION OF THE DRAWINGS

FIG. 1 explains the basic drying mechanism of this invention, wherein the numerical values specifically shown therein as examples are of water which was used as the source of heated vapor (the axes of ordinates show surface temperature T (° C.) of the object to be dried, the moisture content W (mg/l) in the inner space of the vessel, the amount of free water M (g/m$^2$) resided on the surface of the object to be dried and the amount of condensate Q (g) in the graphs (a), (b), (c) and (d), respectively; whereas the axes of abscissas show elapsed time t (the subscripts 0 means when an object to be dried is introduced into the vessel; 1, when introduction of the heated vapor is started; 2, when introduction of the heated vapor is stopped and cooling of the space within the vessel is started; 3, when cooling of the space within the vessel is stopped and introduction of dry gas is started; and 4, when drying operation is completed). The same subscripts attached to T and W, respectively, have the same meanings as those attached to t. The subscripts s, max and f to M show a value before drying, maximum value and final value, respectively. I and II shown referring to Q are the total amount of condensate formed during introduction of the heated vapor and that during cooling, respectively.

FIG. 5-(a) is a vertical cross section of an embodiment of the apparatus for an alternative process of this invention and FIG. 5-(b) is an enlarged view of the pertinent portion thereof.

| A object to be dried | 1 vessel |
|---|---|
| 2 cover | 3 bottom |
| 4 heated vapor introduction pipe | 5 trap |
| 6 condensate overflow pipe | |
| 7 dry gas introduction pipe | 8 cooling section |
| 9 cooling water introduction pipe | |
| 10 cooling water discharge pipe | |
| 11 holder | |
| 12 liquid introduction pipe | |
| 13 heater | 14 condensate discharge pipe |
| 15 drain pipe | 16, 17 gutter |
| 21, 22, 23, 24, 25, 26, 27 valve | |
| 31 pressure detector | 32 temperature detector |
| 33 liquid level detector | |

BEST MODE FOR CARRYING OUT THE INVENTION

Figure 1A:
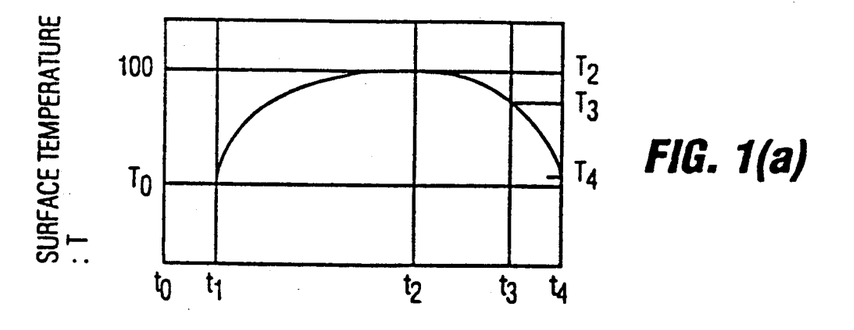
Figure 1B:
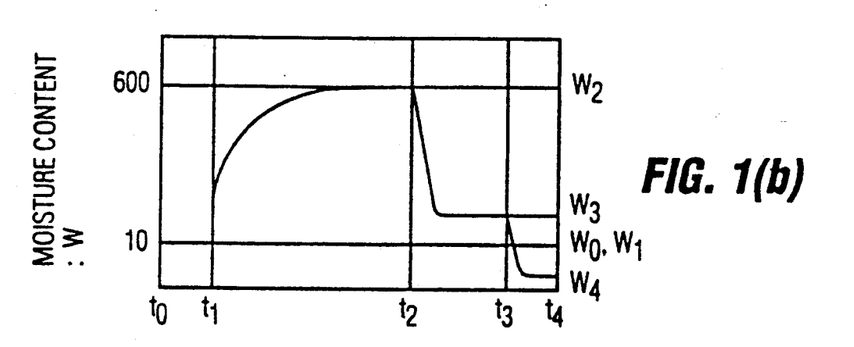
Figure 1C:
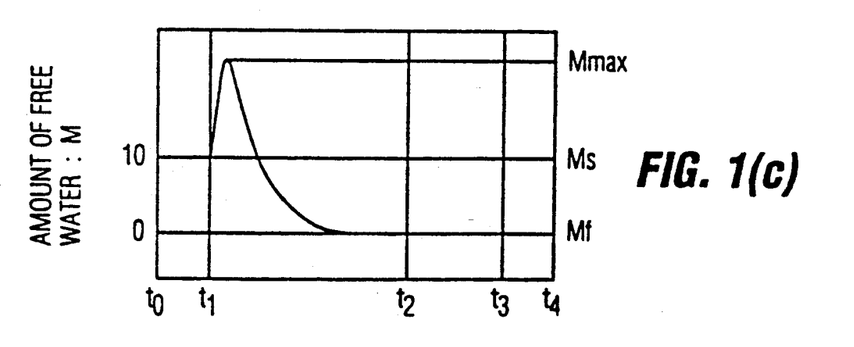
Figure 1D:
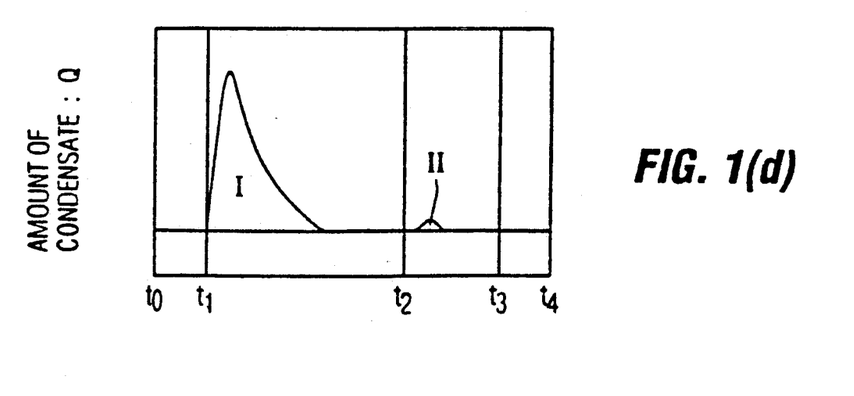
Figure 2:
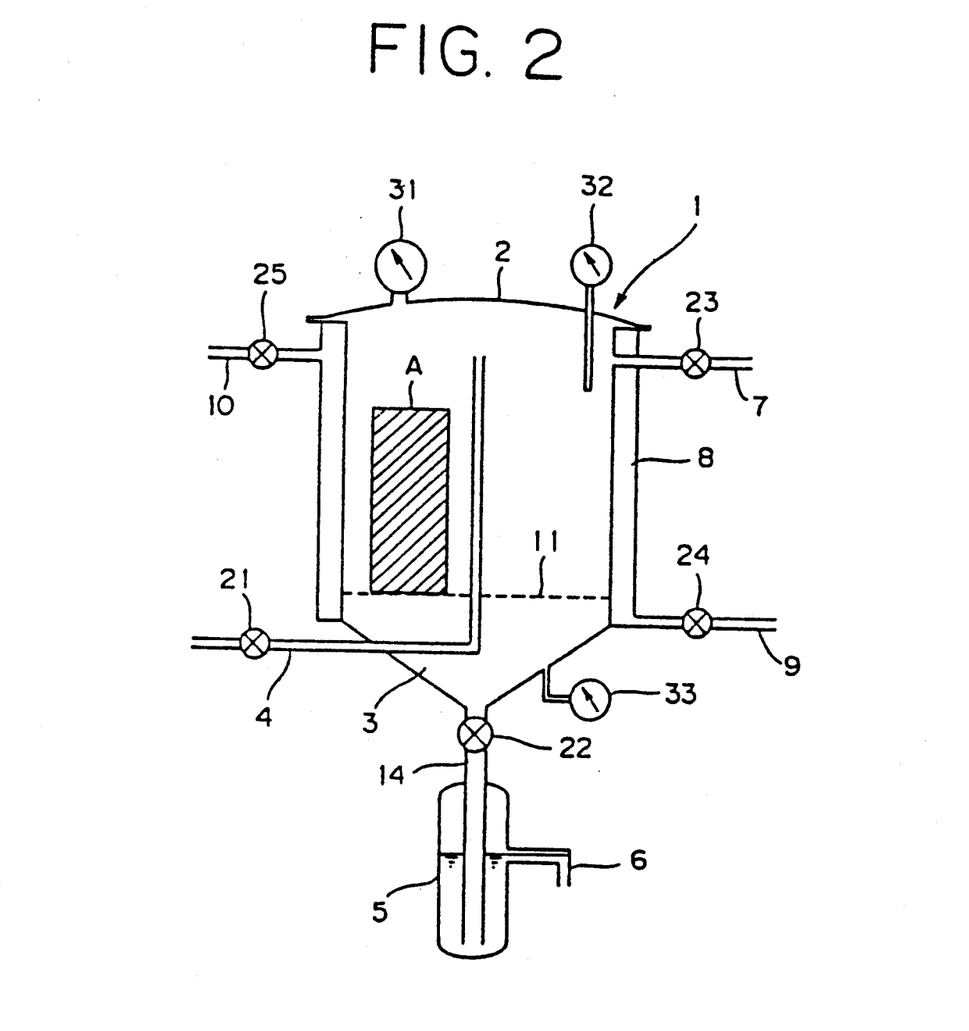
FIG. 2 shows, in vertical cross section, an embodiment of the apparatus of this invention.

Next, this invention will be described in detail by way of nonlimitative embodiments referring to the attached drawings. FIG. 2 shows, in vertical cross section, an embodiment of the drying apparatus of this invention.

The drying apparatus consists of a cylindrical vessel 1 in which an object to be dried A can be placed, having a closed bottom 3 (inverted conical shape) and a cover 2 (which can hermetically seal the vessel); a heated vapor introduction pipe 4 having one end thereof opening to the inside of the vessel; a trap 5 connected to the bottom 3 through a condensate discharge pipe 14; a gas introduction pipe 7 having one end thereof opening to the inside of the vessel; and a cooling section 8 (the double-sided wall structure of the vessel is utilized as the cooling section) to which a cooling water introduction pipe 9 and a cooling water discharge pipe 10 are respectively connected; wherein the object to be dried A is placed on a grid-like holder 11 made of a material having a low thermal conductivity so as to achieve thermal insulation thereof from the cooling section. Incidentally, the pipes 4, 7, 9, 10 and 14 have flow control valves and/or shut-off valves 21, 23, 24, 25 and 22, respectively; while the vessel has a pressure detector 31 and a temperature detector 32 at the top and a liquid level detector 33 at the bottom, respectively.

The procedures of drying using this apparatus will be as follows (the object to be dried A shown in the drawing should be understood to be a single object or a group of objects; and the heated vapor to be a 100° C. water vapor (steam):

An object to be dried A is first placed on the holder 11 in the vessel (wherein the valves 21, 23, 24 and 25 being closed and the valve 22 being open), and then the vessel is closed with the cover 2 (time: $t_0$ in FIG. 1). Subsequently, the valve 21 is opened to introduce a steam into the vessel (time: $t_1 \rightarrow t_2$ in FIG. 1). The steam is obtained by boiling a demineralized water under the atmospheric temperature (the source of steam is not shown), which is condensed as it heats the object to be dried and the vessel itself and replaces the air within the inner space of the vessel while the condensate flows to the outside of the system through the route: condensate discharge pipe 14 → trap 5 → condensate overflow pipe 6. When the temperatures of the object to be dried and the vessel are substantially equal to the steam temperature, condensation of the steam ceases and the vessel is filled with the steam introduced (t: $t_2$ in FIG. 1; where the amount of condensate discharged from the overflow pipe 6 is constant or zero, and the end point of condensation can be known by partial carryover of the steam itself therethrough, which can also be confirmed by the temperature detector 32). The valves 21 and 22 are then closed and the valves 25 and 24 are opened to flow a cooling water through the route: cooling water introduction pipe 9 → cooling section 8 → cooling water discharge pipe 10 (time: $t_2 \rightarrow t_3$ in FIG. 1). The steam filling the vessel after the above operation is condensed on the surface of the cooling section to drop the pressure of the space within the vessel to 0.023 atm (when the preset cooling temperature is 20° C.), whereby the condensate collects at the bottom 3 of the vessel. After monitoring of the end point (time: $t_3$ in FIG. 1) by the liquid level detector 33 to detect that the liquid level is constant and further confirmation of it by the temperature detector 32 to detect that the temperature of the space within the vessel is constant, the valves 24 and 25 are closed to terminate the cooling operation and the valve 23 is opened to introduce a clean dry gas into the vessel through the dry gas introduction pipe 7 and allow the inner space of the vessel to return to atmospheric pressure (which can be monitored by the pressure detector 31). The valve 22 is then opened (to discharge the condensate collected at the bottom of the vessel to the outside of the system), and after the valve 23 is closed, the cover 2 is opened to take out the object to be dried A. Thus, the drying operation is completed and the apparatus is now ready for the next cycle of drying operation. Incidentally, while a combination of the valve 22 and the trap 5 was used as an example of condensate discharging means (which also serves as the means for sealing the inner space of the vessel from the outer air), the condensate discharging means in the apparatus of this invention is not limited to such combination, but the trap 5 can be omitted if a relief valve is used in place of the valve 22.

The above embodiment is the case where water is used as the source of the heated vapor. However, if there is any limitation on the heat resistance of the object to be dried, a hydrophilic low-boiling point organic solvent, for example, various kinds of lower alcohols can be used taking full countermeasures for their inflammabiliy or explosiveness (in facility and operations); wherein the heating temperature is preferably the boiling point of the alcohol. The preset cooling temperature may suitably be selected within the heat drop (temperature difference) between the temperature of the cooling medium to be applicable and the heating temperature.

Figure 3:
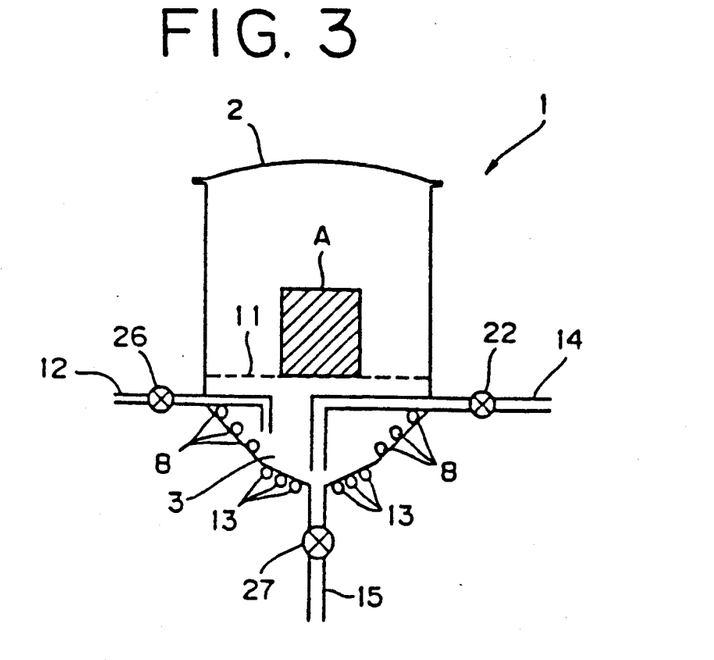
FIGS. 3 and 4 each show, in vertical cross section, another embodiments of the apparatus of this invention, particularly illustrating different ways of introducing the heated vapor (the heated vapor is generated within the system) from that of the apparatus shown in FIG. 2.
Figure 4:
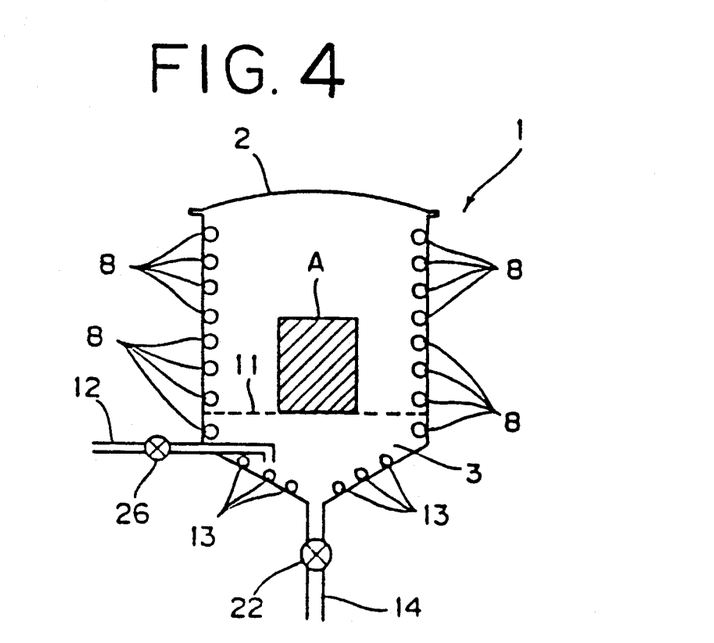

FIGS. 3 and 4 each show, in vertical cross section, another embodiment of the apparatus of this invention, where the necessary heated vapor is generated within the system (the cooling section 8 shown is a substitute for the same used in FIG. 2, which is a piping disposed spirally along the inner surface at the bottom of the vessel (FIG. 3) or along the inner wall surface (FIG. 4)) thereof.

In the embodiment shown in FIG. 3, the above heated vapor introduction pipe 4 is replaced with a liquid introduction pipe 12, and a heater 13 is additionally disposed on the outer surface of the bottom wall of the vessel; where a predetermined amount of liquid is preliminarily introduced to the bottom through the liquid introduction pipe 12, and the liquid thus introduced is heated by the heater 13 to generate a heated vapor in the heated vapor introduction process. The condensate to be formed during the heating is discharged to the outside of the system through the condensate discharge pipe 14 (where the valve 22 is a shut-off valve) with the aid of the pressure of the vapor generated. Incidentally, the pipe 15 is a drain pipe (the valve 27 is a shut-off valve) for discharging the condensate (the total amount of condensate II shown in FIG. 1-(d)) to be formed during the cooling process. The condensate discharge pipe 14 can also be used as a liquid introduction pipe (as occasion demands) by disposing a directional control valve thereto.

In the embodiment shown in FIG. 4, the pipe 14 is allowed to serve as the drain pipe 15 and condensate discharge pipe 14 shown in FIG. 3, and a heater 13 is additionally disposed around the inner surface of the bottom of the vessel (this disposition of heater 13 can also be applied in the apparatus of FIG. 3); where heated vapor can be generated in the same manner as in the apparatus of FIG. 3. It should be noted, however, a relief valve is used as the valve 22, or alternatively the combination of a shut-off valve and a trap 5 as used in the apparatus of FIG. 2 may be used.

In the above two embodiments, the initial amount of liquid to be introduced to the vessel can be secured according to the value calculated by adding the amount of liquid for preventing heating of the vessel with no liquid staying at the bottom of the vessel to the amount of liquid to be determined from the heat capacity to be heated by the vapor and the latent heat of vaporization.

Ten pieces of glass plates (width 150 mm × length 150 mm) having 10 g/m² of free water residing put in a polyethylene basket and dried using the apparatus shown in FIG. 2 (inner diameter; 390 mm; inner height: 579 mm; inner volume: 50 l). The time required for the drying was as follows: $t_0 \rightarrow t_2$: 8 min; $t_2 \rightarrow t_3$: 4 min; $t_3 \rightarrow t_4$: 2 min; total drying time 14 min. The level of finish of drying was very good with no stain or deposit on the surface. Incidentally, 100° C. water vapor was used as the source of the heated vapor, and nitrogen gas as the dry gas.

The drying method of this invention has been described according to the embodiments where the heating operation is carried out with the cover of the vessel being closed, and the cooling operation is carried out under a state where the inner space of the vessel is sealed from the outer air after the introduction of the heated vapor is stopped, followed by introduction of the dry gas after completion of the cooling operation. However, it will be appreciated from the following description that this invention is not limited thereto.

Figure 5A:
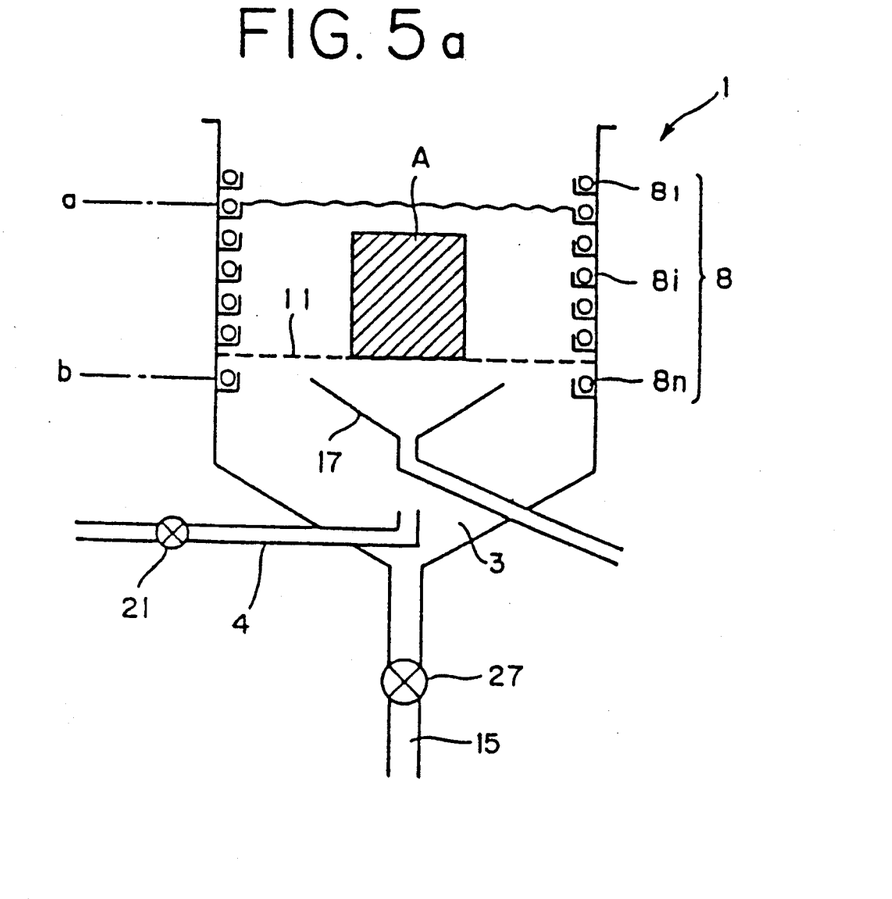
Figure 5B:
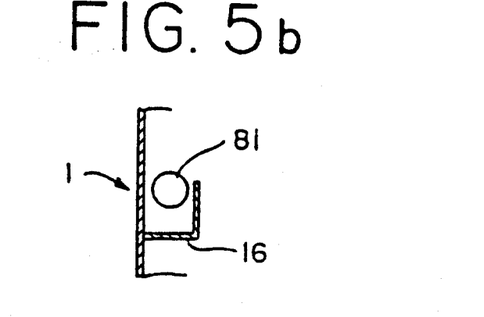

FIG. 5-(a) is a vertical cross section of an embodiment of the drying apparatus for an alternative process of this invention and FIG. 5-(b) is an enlarged view of the pertinent portion thereof.

In this embodiment, the drying apparatus consists of a cylindrical vessel 1 having an open top and a closed bottom 3 having an inverted conical shape, in which an object to be dried can be placed; a heated vapor introduction pipe 4 having one end thereof opening to the vessel at a position below the object to be dryed placed therein; a drain pipe 15 having a shut-off valve 27; cooling sections 8 (ring-form pipings disposed around the inner wall surface of the vessel) each having a cooling water introduction/stop valve (not shown) so as to cool the desired horizontal portion of the space within the vessel; gutters 16$i$ for receiving condensate of the heated vapor formed on the surfaces of the respective cooling pipes 8$i$ ($i=1$ to n) and discharging it to the outside of the vessel; and a receiver 17 for receiving the condensate of the heated vapor formed on the surface of the object to be dried and discharge it to the outside of the vessel. An object to be dried A is placed on a holder 11 thermally insulated from the cooling section like in the apparatuses described above, or the object to be dried may be placed in a basket suspended from the top of the vessel. The sections and parts having the same functions as in the above Figures are shown with the same reference numbers.

The drying procedures using this apparatus are carried out as follows:

After a cooling water is allowed to flow through the cooling pipe 8$i$ above the level "a" of the vessel (wherein the valve 27 is closed), the valve 21 is opened and a steam is introduced to the inner space of the vessel. When the inner space of the vessel below the level "a" is filled with steam, an object to be dried A is placed in the vessel (the upper surface of the object to be dried is below the level "a"). The steam is condensed as it heats the object to be dried and the vessel itself and the condensates are discharged through the receiver 17 disposed below the object to be dried and through the gutters 8$i$ below the level "a", respectively. When the heat exchange between the object to be dried and the steam is equilibrated (where the free water on the surface of the object to be dried is replaced with the steam), a cooling water is introduced to the cooling pipes 8$i$ successively from the upper ones to the lower ones; whereupon the level of the vapor phase lowers from "a" toward "b" and finally drops to "b" (in this operation, and the steam to be introduced to the vessel is preferably regulated by reducing the lift of the valve 21 corresponding to the level reduction. Subsequently, the object to be dried is taken out from the vessel (where the driving force of drying is the surface temperature of the object to be dried which is considerably higher than the temperature of the inner space of the vessel cooled, so that the moisture in the space near the surface of the object to be dried condenses not on the surface of the object to be dried but on the surface of the cooling section). Then, to be ready for the next cycle of drying operation, the valve 27 is first opened to discharge the condensate remaining in the vessel through the drain pipe 15, and the valve 27 is closed followed by stopping the introduction of the cooling water to the cooling pipes 8$i$ successively from the lower ones to the upper ones, while the amount of steam introduced to the vessel is gradually increased to allow the vapor phase to recover the level "a". While this invention is described according to the embodiment where the heated vapor is introduced from the outside of the system, a liquid or the source of the heated vapor, such as a demineralized water and a low-boiling point hydrophilic organic solvent, may preliminarily be introduced to the bottom of the vessel to heat the introduced liquid with a heater and generate the heated vapor within the vessel likewise; wherein the pipe 4 is used as a liquid introduction pipe; the valve 27 disposed to the drain pipe 15 is closed during the one cycle of drying operation; and the amount of heated vapor to be generated is controlled by conventional procedure, for example, using an electric heater by controlling the electric current.

Although this method can achieve a slightly lower level of finish of drying than in any of the above methods since it employs no introduction of dry gas at the final stage of drying operation, this method enjoys shorter drying time and improved operability since this method requires no pressure-tight design of the apparatus because the drying is not carried out under reduced pressure.

The level of finish of drying in this method is sufficiently high compared with the ones achieved by the conventional methods, and thus this method can fully be utilized as a convenient method for drying objects having simple structures such as plates.

INDUSTRIAL APPLICABILITY

As has been described heretofore, the method or the apparatus of this invention is very useful in industrial applications since it can be employed for drying electronic parts such as semiconductors, liquid-crystal display devices and printed wiring boards, optical parts such as lenses and prisms, precision instrument parts such as gears and lead frames, having been subjected to advanced cleaning, surface treatments, etc. to achieve a high level of finish of drying with safety and in a short time.

Further, this invention has the following advantages which have never been achieved by the conventional methods.

1) Particularly excellent level of finish of drying can be achieved by the use of a purified vapor and a clean gas, which are used only once and discarded each time.

(2) Objects with complicated shapes can be dried without limitation to the size and shape thereof.

3) Due to the absence of movable part in the drying system and to the simple structure thereof, troubles occur very rarely, facilitaing automatic operation. The object to be dried is free from the fear of recontamination, and further some degree of cleaning effect can be expected from the drying process.

4) The drying process requires very small amounts of materials to be consumed, enabling low cost drying.

What is claimed is:

1. A method of drying an object to be dried which comprises
    introducing a heated vapor into a vessel in which the object to be dried is placed, to heat the object to be dried and also to replace the air within the vessel with the heated vapor for heating,
    hermetically sealing the vessel,
    cooling the inner space of the vessel after the vessel is hermetically sealed from the outer air to condense the vapor and reduce the pressure in the vessel, and thereafter
    introducing a dry gas into the vessel.

2. The method according to claim 1, wherein the object to be dried is heated to a temperature substantially equal to that of the heated vapor.

3. The method according to claim 2, wherein the heated vapor is of water.

4. The method according to claim 2, wherein the heated vapor is of a hydrophilic organic solvent having a temperature which can produce a vapor pressure of at least atmospheric pressure.

5. An apparatus for drying an object to be dried by a method including introducing a heated vapor into a vessel containing the object to be dried, to heat the object and also to replace the air within the vessel with the heated vapor, thereafter sealing the vessel and cooling the inner space of the vessel, followed by introduction of a dry gas thereinto; said apparatus comprising
    a vessel for accommodating the object to be dried having (a) a heated vapor introduction means, (b) a cooling means for cooling the inner space of the vessel, (c) a means for collecting and discharging condensate, (d) a dry gas introduction means, (e) a structure wherein the cooling section of the cooling means and the object to be dried can be thermally insulated from each other, and (f) means to seal the inner space of the vessel from the outer air.

6. The apparatus according to claim 5, wherein the vessel is a cylindrical steel container having an open top and a closed bottom, which can be closed with a cover provided at the upper position of the container to form the sealing means.

7. The apparatus according to claim 6, wherein the cooling means is the one having a cooling surface disposed in the inner space of the vessel for indirectly cooling said space through said surface, and the cooling surface is disposed to be horizontally spaced from the position of the object to be dried placed in the vessel or disposed below said position both to thermally insulate the object to be dried from the cooling means and to avoid having condensate formed on the cooling surface fall on the object to be dried.

8. An apparatus for drying an object to be dried by a method including introducing a heated vapor into a vessel containing the object to be dried, to heat the object and also to replace the air within the vessel with the heated vapor, thereafter sealing the vessel and cooling the inner space of the vessel, followed by introduction of a dry gas thereinto; said apparatus comprising
    a vessel for accommodating the object to be dried having (a) a heated vapor introduction means, (b) a cooling means for cooling the inner space of the vessel, (c) a means for collecting and discharging condensate, (d) a dry gas introduction means, (e) a structure wherein the cooling section of the cooling means and the object to be dried can be thermally insulated from each other, and (f) means to seal the inner space of the vessel from the outer air and wherein
    the vessel is a cylindrical steel container having an open top and a closed bottom, which can be closed with a cover provided at the upper position of the container to form the sealing means;
    the cooling means is one having a cooling surface disposed in the inner space of the vessel for indirectly cooling said space through said surface, and the cooling surface is disposed to be horizontally spaced from the position of the object to be dried placed in the vessel or disposed below said position both to thermally insulate the object to be dried from the cooling means and to avoid having condensate formed on the cooling surface fall on the object to be dried; and
    the structure thermally insulating the cooling section from the object to be dried comprises brackets fixed at the upper positions of the side wall in the bottom of the vessel and a holder attached to the bracket to hold the object to be dried, both made of a material having a low thermal conductivity, or comprises a hanger fixed to the cover of the container and a basket suspended from said hanger for carrying therein the object to be dried.

9. The apparatus according to claim 8, wherein the means to seal the inner space of the vessel from the outer air consists of a cover which is engaged at the top of the vessel to hermetically seal it and a trap either formed by sealing, with liquid, the lower end of a condensate discharge pipe connected to the bottom of the vessel or formed by a valve disposed in the condensate discharge pipe.

10. The apparatus according to claim 6, wherein the heated vapor introduction means comprises a heater disposed on the bottom of the vessel to heat the liquid or the source of the heated vapor preliminarily introduced to the lower spaced of the vessel and generate the necessary heated vapor.

11. The apparatus according to claim 8, wherein the heated vapor introduction means comprises a heater disposed on the bottom of the vessel to heat the liquid or the source of the heated vapor preliminarily introduced to the lower space of the vessel and generate the necessary heated vapor.

* * * * *